(12) United States Patent
Tam et al.

(10) Patent No.: US 7,583,146 B2
(45) Date of Patent: Sep. 1, 2009

(54) BALANCED DIFFERENTIAL CROSS-COUPLED TRANSCONDUCTANCE AMPLIFIER FOR A MULTIPLEXOR

(75) Inventors: Kimo Y. F. Tam, Lincoln, MA (US);
Kenneth A. Lawas, Kensington, NH (US)

(73) Assignee: Analog Devices, Inc., Norwood, MA (US)

( * ) Notice: Subject to any disclaimer, the term of this patent is extended or adjusted under 35 U.S.C. 154(b) by 64 days.

(21) Appl. No.: 11/818,739

(22) Filed: Jun. 15, 2007

(65) Prior Publication Data
US 2008/0309409 A1 Dec. 18, 2008

(51) Int. Cl.
*H03F 3/45* (2006.01)
(52) U.S. Cl. ...................................... 330/260
(58) Field of Classification Search ............... 330/85, 330/260, 252, 259; 327/563
See application file for complete search history.

(56) References Cited

U.S. PATENT DOCUMENTS 5,635,874 A * 6/1997 Perrot ........................ 330/259
6,175,276 B1 * 1/2001 Lorenz ....................... 330/260
6,633,191 B2 * 10/2003 Hu .............................. 327/323

OTHER PUBLICATIONS

AD830, High Speed Video Difference Amplifier, Analog Devices, Inc., Norwood, MA 02062, 2003, pp. 1-16.

* cited by examiner

*Primary Examiner*—Steven J Mottola
(74) *Attorney, Agent, or Firm*—Goodwin Procter LLP

(57) ABSTRACT

A balanced, differential, cross-coupled amplifier including an input stage for receiving a differential input and including an input transconductance differential pair and a feedback transconductance differential pair; and an output stage responsive to the input stage for providing a differential output; the differential input being connected to one input of the input transconductance differential pair and one input of the feedback transconductance differential pair, the differential output being fed back to one input of the input transconductance differential pair and one input of the feedback transconductance differential pair for balancing the currents in the transconductance differential pairs over the input range.

24 Claims, 4 Drawing Sheets

BALANCED DIFFERENTIAL CROSS-COUPLED TRANSCONDUCTANCE AMPLIFIER FOR A MULTIPLEXOR

FIELD OF THE INVENTION

A balanced differential cross-coupled transconductance amplifier and more particularly to a multiplexer or cross-point switch using such an amplifier.

BACKGROUND OF THE INVENTION

In one conventional differential active feedback amplifier a differential input voltage is applied to the transconductance input stage. An output current proportional to the input is collected in the folded cascode, creating a current imbalance which will drive the output voltage. The differential output voltage is applied to a second, matched transconductance feedback pair. When the output voltage reaches the same differential potential as the input voltage, the currents will balance and the amplifier will reach steady state. This circuit presents a few drawbacks when it is used in a crosspoint switch array multiplexer. First, the input stage must not be driven to the point where it limits and has no additional output current. If this occurs, the output stage will stop moving at the point at which all the current has been steered to one input device. In order to make a linear amplifier, the input stage and feedback stage must be degenerated with voltage at least as great as the desired input/output swing. In practice, this requires large resistances or large currents, neither of which is desirable in a crosspoint switch with 1,000 or more replicated input stages. These large resistances can create larger input referred noise. This degeneration reduces gain, which increases offset voltage, gain error and noise contributions from the rest of the circuit. This circuit can tolerate non-linearities as long as they are the same in both the input stage and feedback stage. However, in a crosspoint switch with many replicated input stages, the distance from the driving input stage to the feedback stage may be very large (over 5 mm). In practice, this creates large mismatches between transistors and degeneration resistors that will create gain error in the amplifier. It can also be seen that when a non-zero, steady-state input is applied the input stage will be "tipped", and this amount of tip will be replicated in the output stage. When tipped, the output conductance of the two input transistors will not be equal. In a crosspoint switch, there are often "hostile" signals crossing the outputs of the input stages, and these will couple unequally into the unmatched output conductances. This results in more hostile feedback than if the input transistors were in matched operating conditions. Additionally, there is increased distortion due to any input to feedback device mismatches forcing the input and feedback devices to be in slightly different operating points on their I-V transfer functions.

BRIEF SUMMARY OF THE INVENTION

It is therefore an object of this invention to provide an improved amplifier.

It is a further object of this invention to provide an improved balanced, differential, cross-coupled amplifier.

It is a further object of this invention to provide a multiplexer and cross-point switches made with such an improved balanced, differential, cross-coupled amplifier.

It is a further object of this invention to provide such an improved balanced, differential, cross-coupled amplifier which comes to steady state in a balanced (zero voltage) condition.

It is a further object of this invention to provide such an improved balanced, differential, cross-coupled amplifier which requires little or no degeneration for larger input/output ranges.

It is a further object of this invention to provide such an improved balanced, differential, cross-coupled amplifier which reduces circuit area and necessary current.

It is a further object of this invention to provide such an improved balanced, differential, cross-coupled amplifier which exhibits less noise, less voltage offset and better gain accuracy.

It is a further object of this invention to provide such an improved balanced, differential, cross-coupled amplifier which because the feedback transconductance devices are entirely within the input stage, can be coupled in close-proximity and matching will be much better for large arrays.

It is a further object of this invention to provide such an improved balanced, differential, cross-coupled amplifier in which it is no longer necessary to match transistors or degeneration resistors across a chip in order to maintain low differential gain errors.

It is a further object of this invention to provide such an improved balanced, differential, cross-coupled amplifier in which, due to the fact that current balance occurs within the input transconductance pair, the output conductances in the potentially long current lines running from input stage to folded cascode are balanced and therefore, hostile signals that cross these lines will couple in a balanced manner, producing only common-mode feedback which will not affect the differential output voltage.

The invention results from the realization that an improved differential amplifier which is balanced even when tipped can be achieved by merging and cross-coupling the input and feedback stages including an input transconductance differential pair and a feedback transconductance differential pair so that the differential input is connected to one input of the input transconductance differential pair and one input of the feedback transconductance differential pair and the differential output is fed back to one input of the input transconductance differential pair and one input of the feedback transconductance differential pair for balancing the currents in the transconductance differential pairs over the input range.

The subject invention, however, in other embodiments, need not achieve all these objectives and the claims hereof should not be limited to structures or methods capable of achieving these objectives.

This invention features a balanced, differential, cross-coupled amplifier including an input stage for receiving a differential input and including an input transconductance differential pair and a feedback transconductance differential pair. An output stage responsive to the input stage for providing a differential output. The differential input is connected to one input of the input transconductance differential pair and one input of the feedback transconductance differential pair. The differential output is fed back to one input of the input transconductance differential pair and one input of the feedback transconductance differential pair for balancing the currents in the transconductance differential pairs over the input range.

In a preferred embodiment the transconductance differential pair may include an input transistor and a feedback transistor. The input transistor in one pair may be responsive to the positive input and the feedback transistor in the other pair may be responsive to the negative feedback with their positive electrodes connected to a first node. The input transistor in the other pair may be responsive to the negative input and the feedback transistor in the one amplifier may be responsive to the positive feedback with their positive electrodes connected to second node. The transistors may be bipolar junction transistors. The transistors may be field effect transistors including MOSFETs and JFETs.

This invention also features a balanced differential multiplexer including a plurality of input stages for receiving differential inputs and an output stage responsive to the input stages for providing a differential output. Each input stage includes an input transconductance differential pair and a feedback transconductance differential pair. The differential input is connected to one input of the input transconductance differential pair and one input of the feedback transconductance differential pair. The differential output is fed back to one input of the input transconductance differential pair and one input of the feedback transconductance differential pair for balancing the currents in the transconductance differential pairs over the input range.

In a preferred embodiment the transconductance differential pair may include an input transistor and a feedback transistor. The input transistor in one pair may be responsive to the positive input and the feedback transistor in the other pair may be responsive to the negative feedback with their positive electrodes connected to a first node. The input transistor in the other pair may be responsive to the negative input and the feedback transistor in the one amplifier may be responsive to the positive feedback with their positive electrodes connected to second node. The transistors may be bipolar junction transistors. The transistors may be field effect transistors including MOSFETs and JFETs.

This invention also features a balanced differential crosspoint switch including a plurality of input stages for receiving differential inputs and at least one output stage responsive to the input stages for providing a differential output. Each input stage includes an input transconductance differential pair and a feedback transconductance differential pair. The differential input is connected to one input of the input transconductance differential pair and one input of the feedback transconductance differential pair. The differential output is fed back to one input of the input transconductance differential pair and one input of the feedback transconductance differential pair for balancing the currents in the transconductance differential pair over the input range.

In a preferred embodiment the transconductance differential pair may include an input transistor and a feedback transistor. The input transistor in one pair may be responsive to the positive input and the feedback transistor in the other pair may be responsive to the negative feedback with their positive electrodes connected to a first node. The input transistor in the other pair may be responsive to the negative input and the feedback transistor in the one amplifier may be responsive to the positive feedback with their positive electrodes connected to second node. The transistors may be bipolar junction transistors. The transistors may be field effect transistors including MOSFETs and JFETs.

This invention also features a switched current source including an input stage for receiving a differential input and including an input transconductance differential pair and a feedback transconductance differential pair. An output stage responsive to said input stage for providing a differential output. The differential input is connected to one input of the input transconductance differential pair and one input of the feedback transconductance differential pair. The differential output is fed back to one input of the input transconductance differential pair and one input of the feedback transconductance differential pair for balancing the currents in the transconductance differential pairs over the input range.

In a preferred embodiment the transconductance differential pair may include an input transistor and a feedback transistor. The input transistor in one pair may be responsive to the positive input and the feedback transistor in the other pair may be responsive to the negative feedback having their positive electrodes connected to a first node. The input transistor in the other pair may be responsive to the negative input and the feedback transistor in the one amplifier may be responsive to the positive feedback having their positive electrodes connected to second node. The transistors may be bipolar junction transistors. The transistors may be field effect transistors including MOSFETs and JFETs.

This invention also features a switched current source including a plurality of input stages for receiving differential inputs and an output stage responsive to the input stages for providing a differential output. Each input stage includes an input transconductance differential pair and a feedback transconductance differential pair. The differential input is connected to one input of the input transconductance differential pair and one input of the feedback transconductance differential pair. The differential output is fed back to one input of the input transconductance differential pair and one input of the feedback transconductance differential pair for balancing the currents in the transconductance differential pairs over the input range.

In a preferred embodiment the transconductance differential pair may include an input transistor and a feedback transistor. The input transistor in one pair may be responsive to the positive input and the feedback transistor in the other pair may be responsive to the negative feedback having their positive electrodes connected to a first node. The input transistor in the other pair may be responsive to the negative input and the feedback transistor in the one amplifier may be responsive to the positive feedback having their positive electrodes connected to second node. The transistors may be bipolar junction transistors. The transistors may be field effect transistors including MOSFETs and JFETs.

This invention also features a switched current source including a plurality of input stages for receiving differential inputs and at least one output stage responsive to the input stages for providing a differential output. Each input stage includes an input transconductance differential pair and a feedback transconductance differential pair. The differential input is connected to one input of the input transconductance differential pair and one input of the feedback transconductance differential pair. The differential output is fed back to one input of the input transconductance differential pair and one input of the feedback transconductance differential pair for balancing the currents in the transconductance differential pair over the input range.

In a preferred embodiment the transconductance differential pair may include an input transistor and a feedback transistor. The input transistor in one pair may be responsive to the positive input and the feedback transistor in the other pair may be responsive to the negative feedback having their positive electrodes connected to a first node. The input transistor in the other pair may be responsive to the negative input and the feedback transistor in the one amplifier may be responsive to the positive feedback having their positive electrodes connected to second node. The transistors may be bipolar junction transistors. The transistors may be field effect transistors including MOSFETs and JFETs.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
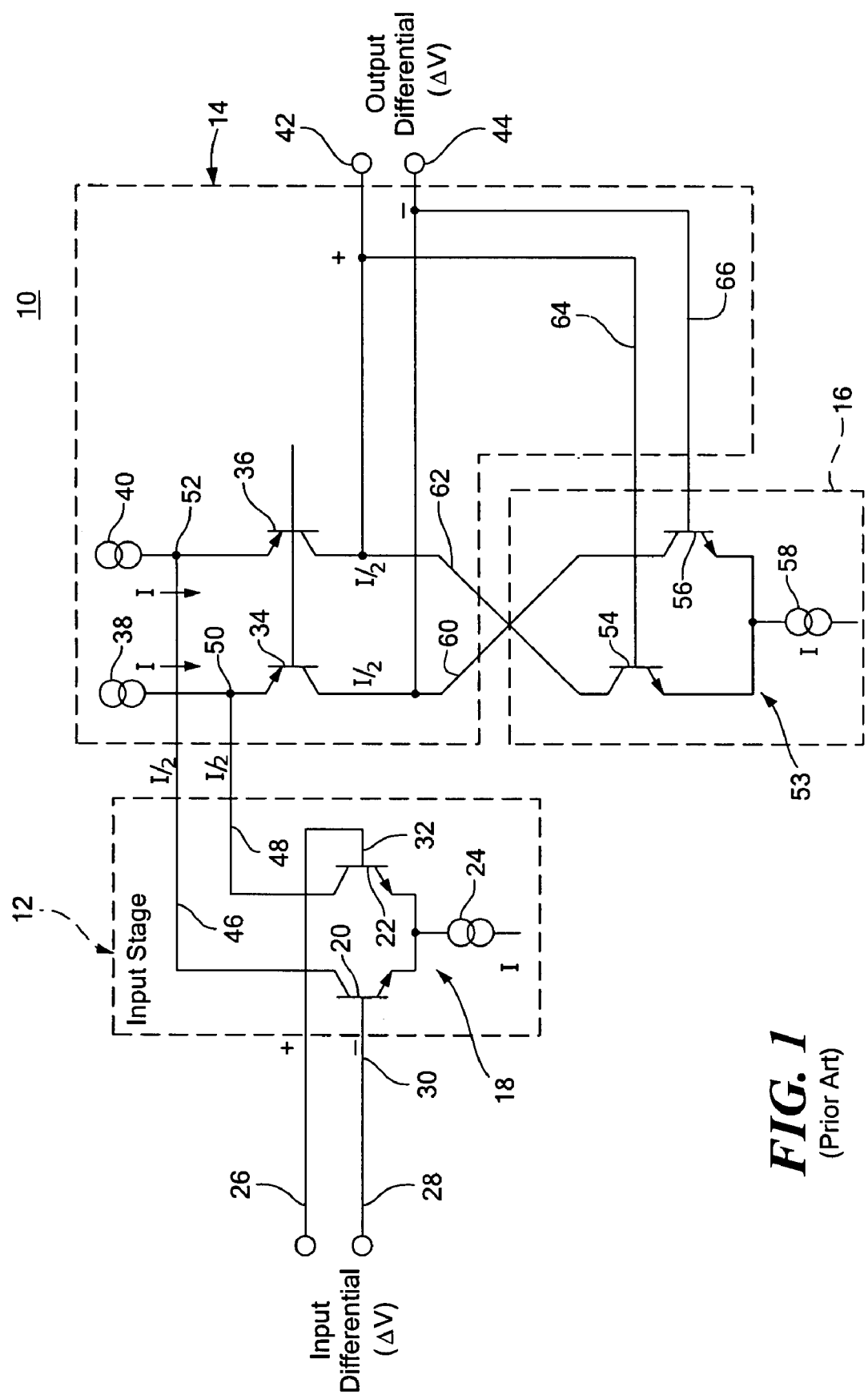
FIG. 1 is a schematic diagram of a prior art differential active feedback amplifier.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a prior art differential amplifier 10 with active feedback. It includes an input stage 12, output stage 14 and active feedback stage 16. Input stage 12 includes a transconductance pair 18 comprised of two transistors 20 and 22; there is also a current source 24. The differential inputs at terminals 26 and 28 are connected to the bases 30, 32 of transistors 20 and 22. Output stage 14 includes a pair of cascode connected transistors 34, 36 served by current sources 38 and 40 to provide a differential output at terminals 42 and 44. The outputs 46, 48 of input stage 12 are connected to cascode transistors 34, 36 at nodes 50 and 52. Active feedback pair 16 includes a transconductance pair 53 of transconductance transistors 54, 56 with emitters connected to a common current source 58 and their outputs 62, 60 connected to cascode transistors 36 and 34, respectively.

In operation, with zero volts input between terminals 26 and 28 the currents, I, supplied by current sources 38 and 40 split evenly so that each of lines 46 and 48 carry I/2 and current source 24 sinks the sum I/2 plus I/2 or I. Similarly, I/2 flows in each of cascode transistors 34 and 36 and lines 60 and 62 through transistors 56 and 54 and they sum as the current I in current source 58. In this condition the output voltage between terminals 42 and 44 is equal to the input voltage at zero and the system is in balance.

If the circuit is now tipped by providing a voltage $\Delta V$ between input terminals 26 and 28; transistor 22 is driven to conduct more and transistor 20 to conduct less. The current in line 48 increases, for example, to 0.9I while the current in line 46 decreases to 0.1I. Their sum still equals I. Similarly, the currents through cascode transistors 34 and 36 are complementary. That is, the current through transistor 34 is 0.1I and through transistor 36 is 0.9I, driving up the output voltage between terminals 42 and 44. The feedback on lines 64 and 66 caused transistors 54 and 56 to conduct unevenly so that transistor 54 conducts 0.9I and transistor 56 0.1I. In this steady state condition the voltage at the output 42, 44 is equal to the voltage at the input 26, 28. And the currents are steady but the input stage 12 and feedback stage 53 are tipped.

Figure 2:
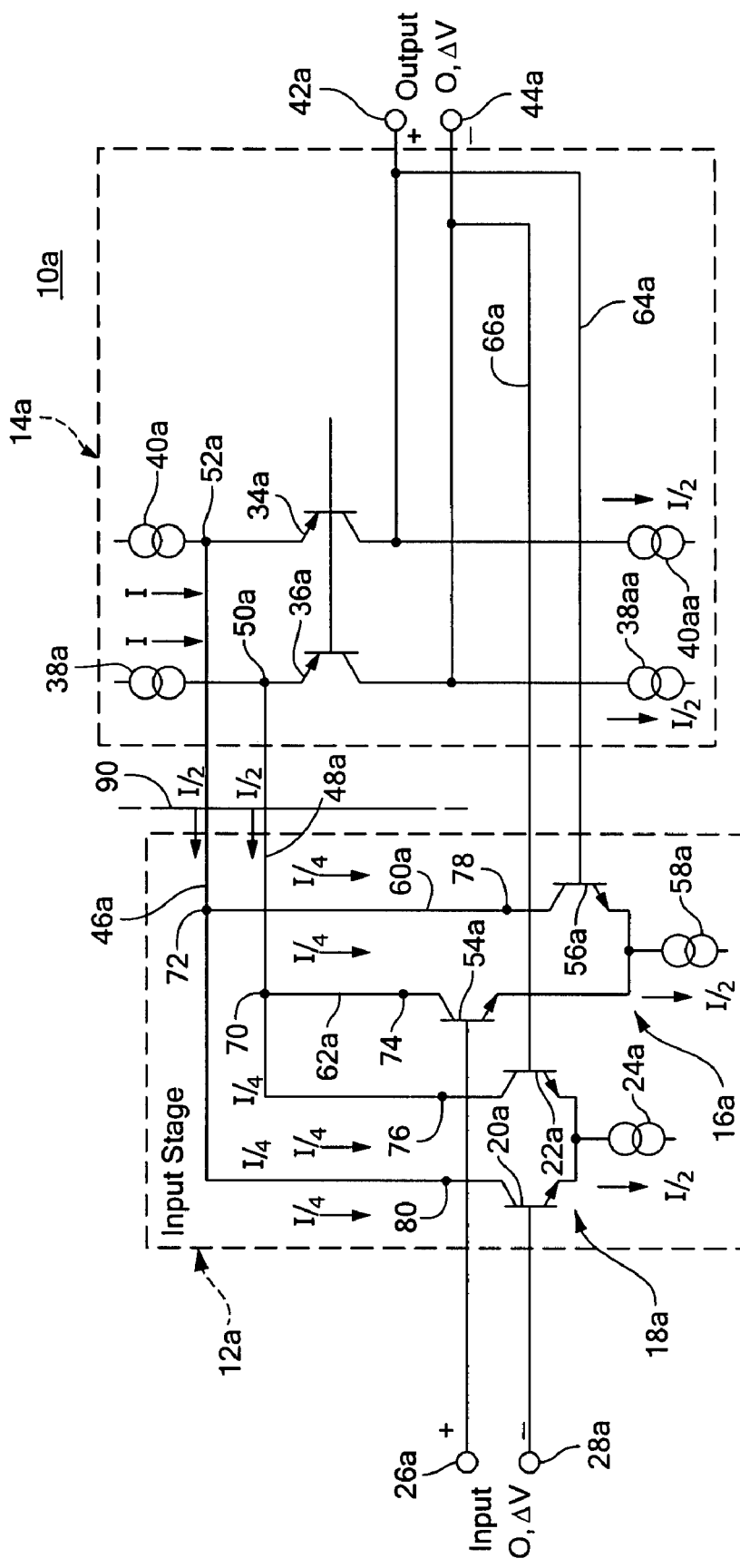
FIG. 2 is a schematic diagram of a cross-coupled, balanced differential amplifier according to this invention.

In contrast the cross coupled amplifier 10a, FIG. 2, of this invention employs a similar output stage 14a with the addition of two constant current sources 38aa and 40aa to sink the folded cascode current. But now the feedback transconductance pair 16a and the input transconductance differential pair 18a have been merged or cross coupled in the input stage 12a. The transistors may be bipolar junction transistors, or FETs such as MOSFETs or JFETs.

In operation, with zero volts at the input 26a, 28a, the circuit is in balance: there is zero volts at the output 42a, 48a and the currents are balanced. Thus, current sources 38a and 40a each produce the current I: half of that current flows through cascode transistors 36 and 34a to be received at current sources 38aa and 40aa. With equal currents flowing the output, as indicated, is zero volts at terminals 42a and 44a. The other half of the current from current sources 38a and 40a splits so that I/2 flows in each of lines 46a and 48a. After nodes 70 and 72 the current splits again so that each of the transistors 20a, 22a, 54a, 56a receives a current of I/4. Current sources 24a and 58a each receive the current I/2. The merging and cross coupling of the feedback pair 16a and input pair 18a can be seen by the fact that the input transistor 54a in pair 16a responsive to the positive input 26a and the feedback transistor 22a in the other pair 18a responsive to the negative feedback 66a have their positive electrodes 74, 76 connected to a first node 70. In contrast the input transistor 20a in pair 18a responsive to the negative input 28a and the feedback transistor 56a in pair 16a responsive to the positive feedback 64a have their positive electrodes 80, 78 connected to the second node 72.

When finally a voltage $\Delta V$ is applied at the input 26a, 28a, at the first instant before the output 42a, 44a responds, a voltage of $\Delta V/2$ appears across each transconductance pair 18a and 16a. This causes the currents at electrodes 74, 78 and 76, 80 to be imbalanced. This imbalance is reflected in lines 46a and 48a as well as in cascode devices 36a and 34a. The current imbalance causes a voltage to appear at the output 42a, 44a. The voltage fed back on lines 64a and 66a changes the conduction of transistors 22a and 56a until the output voltage $\Delta V$ equals the input voltage $\Delta V$. However, in this invention the currents in transconductance pairs 18a and 16a are in balance so that the currents at electrodes 74, 78, 76 and 80 and also flowing in lines 46a and 48a are balanced, unlike the prior art. The fact that the currents at steady state are balanced means that the currents flowing in lines 46a and 48a are balanced and this provides a bonus benefit in that any hostile lines crossing it will see no differential across the two lines. So that hostile line 90, for example, will see equal impedances. These two input transconductance pairs are utilized, with cross-wired outputs. This configuration provides local, differential feedback current balance at the input stage when in steady-state. When the input is driven or tipped, output currents will be imbalanced during slew in the cascode, until which point the differential outputs have moved to the same voltage as the input. After this, the input stages will again have balanced output currents. It can be seen that the differential voltage in each transconductance input pair will be zero in steady-state, even with large differential voltages between the inputs. Because the feedback transconductance devices are entirely within the input stage, they can be coupled in close-proximity and matching will be much better when used in large arrays. There will no longer be a need to match transistors or degeneration resistors across a chip in order to maintain low differential gain errors.

Due to the fact that current balance occurs within the input transconductance pair, the output conductances in the potentially long current lines running from input stage to folded cascode are balanced. Hostile signals that cross these lines will couple in a balanced manner, producing only common-mode feedback which will not affect the differential output voltage. An additional feedback mechanism, the crossing over the output voltage feedback lines, will also produce only a common-mode error current and will not affect the differential output voltage.

Figure 3:
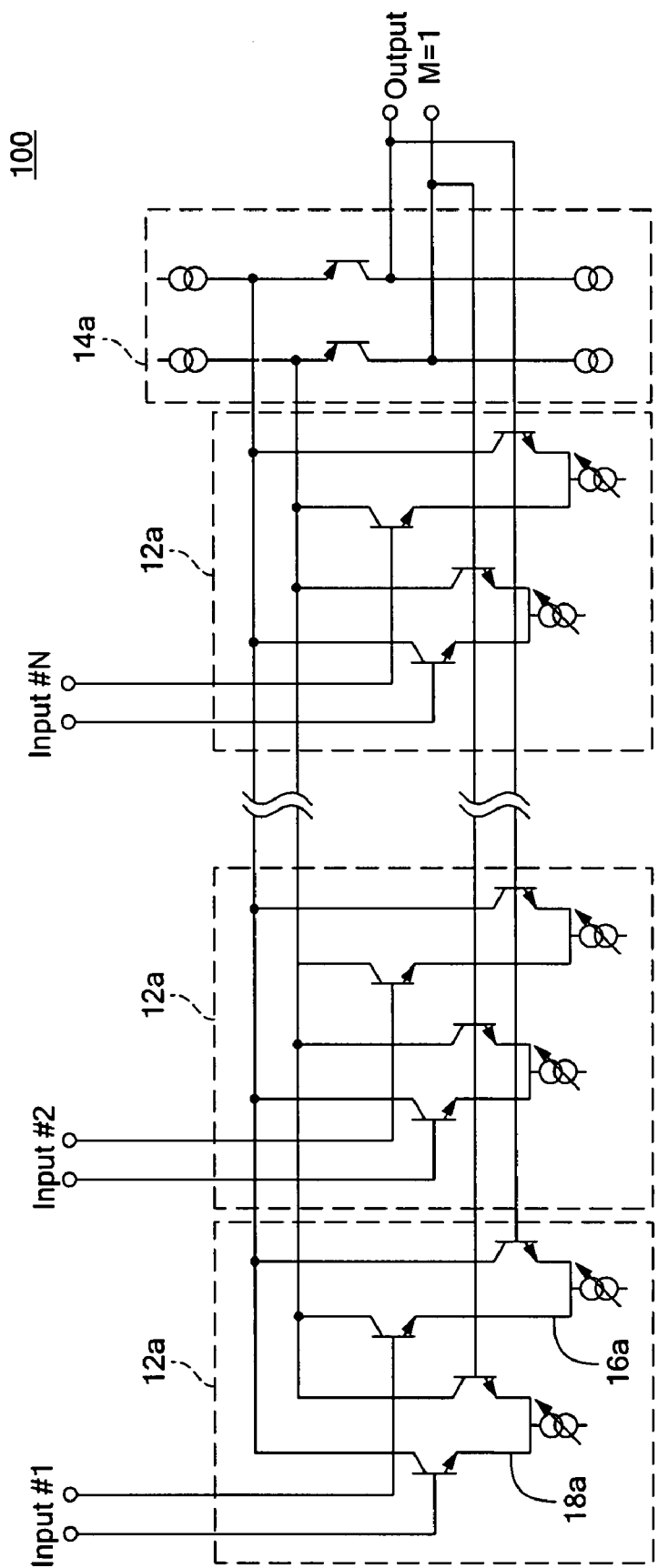
FIG. 3 is a schematic block diagram of a multiplexer using the cross-coupled, balanced differential amplifier according to this invention.
Figure 4:
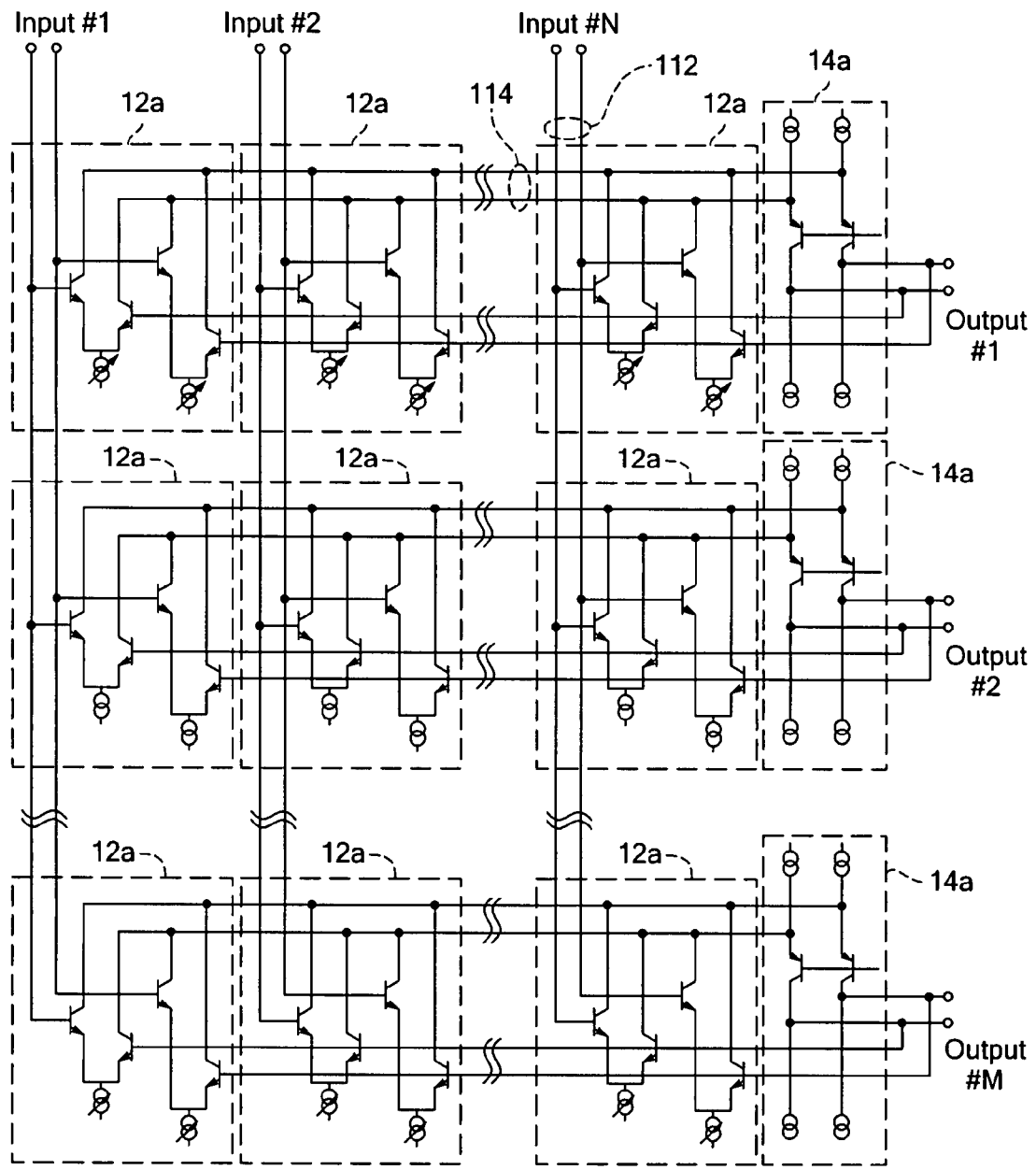
FIG. 4 is a schematic block diagram of a cross-point switch using the cross-coupled, balanced, differential amplifier according to this invention.

The invention lends itself to facilitate improved multiplexers and cross point switches. For example as shown in FIG. 3 in multiplexer 100 a single output stage 14a serves a number of input stages 12a to form the multiplexer, but now the components in the feedback pair 16a in each case are immediately proximate the associated input pair 18a regardless of how many input stages are used are how far they extend along the chip. In a multiplexer there are N replicated inputs and M outputs where M equals one, e.g. multiplexer 100, FIG. 3. In a cross point switch, 110 FIG. 4, there are N inputs and M outputs where M is a number larger than one. In this case not only input stages 12a are replicated but the output stage 14a are also replicated. The hostile crossing problem is most apparent in a cross point application such as in FIG. 4, where for example input lines 112 are crossing output lines 114.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A balanced, differential, cross-coupled amplifier comprising;
   an input stage for receiving a differential input and including an input transconductance differential pair and a feedback transconductance differential pair; and
   an output stage responsive to said input stage for providing a differential output; said differential input being connected to one input of said input transconductance differential pair and one input of said feedback transconductance differential pair, said differential output being fed back to one input of said input transconductance differential pair and one input of said feedback transconductance differential pair for balancing the currents in said transconductance differential pairs over the input range.

2. The balanced, differential, cross-coupled amplifier of claim 1 in which each transconductance differential pair includes an input transistor and a feedback transistor; the input transistor in one pair responsive to the positive input and the feedback transistor in the other pair responsive to the negative feedback having their positive electrodes connected to a first node, and the input transistor in the other pair responsive to the negative input and the feedback transistor in the one amplifier responsive to the positive feedback having their positive electrodes connected to second node.

3. The balanced, differential, cross-coupled amplifier of claim 2 in which said transistors are bipolar junction transistors.

4. The balanced, differential, cross-coupled amplifier of claim 2 in which said transistors are field effect transistors including MOSFETs and JFETs.

5. A balanced differential multiplexer comprising:
   a plurality of input stages for receiving differential inputs;
   an output stage responsive to the input stages for providing a differential output; each input stage including an input transconductance differential pair and a feedback transconductance differential pair; said differential input being connected to one input of said input transconductance differential pair and one input of said feedback transconductance differential pair, said differential output being fed back to one input of said input transconductance differential pair and one input of said feedback transconductance differential pair for balancing the currents in said transconductance differential pairs over the input range.

6. The balanced, differential, multiplexer of claim 5 in which each transconductance differential pair includes an input transistor and a feedback transistor; the input transistor in one pair responsive to the positive input and the feedback transistor in the other pair responsive to the negative feedback having their positive electrodes connected to a first node, and the input transistor in the other pair responsive to the negative input and the feedback transistor in the one amplifier responsive to the positive feedback having their positive electrodes connected to second node.

7. The balanced, differential, multiplexer of claim 6 in which said transistors are bipolar junction transistors.

8. The balanced, differential multiplexer of claim 6 in which said transistors are field effect transistors including MOSFETs and JFETs.

9. A balanced differential cross-point switch comprising:
   a plurality of input stages for receiving differential inputs;
   at least one output stage responsive to the input stages for providing a differential output,
      each input stage including an input transconductance differential pair and a feedback transconductance differential pair; said differential input being connected to one input of said input transconductance differential pair and one input of said feedback transconductance differential pair, said differential output being fed back to one input of said input transconductance differential pair and one input of said feedback transconductance differential pair for balancing the currents in said transconductance differential pair over the input range.

10. The balanced, differential, cross-point switch of claim 9 in which each transconductance differential pair includes an input transistor and a feedback transistor; the input transistor in one pair responsive to the positive input and the feedback transistor in the other pair responsive to the negative feedback having their positive electrodes connected to a first node, and the input transistor in the other pair responsive to the negative input and the feedback transistor in the one amplifier responsive to the positive feedback having their positive electrodes connected to second node.

11. The balanced, differential, cross-point switch of claim 10 in which said transistors are bipolar junction transistors.

12. The balanced, differential cross-point switch of claim 10 in which said transistors are field effect transistors including MOSFETs and JFETs.

13. A switched current source comprising;
   an input stage for receiving a differential input and including an input transconductance differential pair and a feedback transconductance differential pair; and
   an output stage responsive to said input stage for providing a differential output; said differential input being connected to one input of said input transconductance differential pair and one input of said feedback transconductance differential pair, said differential output being fed back to one input of said input transconductance differential pair and one input of said feedback transconductance differential pair for balancing the currents in said transconductance differential pairs over the input range.

14. The switched current source of claim 13 in which each transconductance differential pair includes an input transistor and a feedback transistor; the input transistor in one pair responsive to the positive input and the feedback transistor in the other pair responsive to the negative feedback having their positive electrodes connected to a first node, and the input transistor in the other pair responsive to the negative input and the feedback transistor in the one amplifier responsive to the positive feedback having their positive electrodes connected to second node.

15. The switched current source of claim 14 in which said transistors are bipolar junction transistors.

16. The switched current source of claim 14 in which said transistors are field effect transistors including MOSFETs and JFETs.

17. A switched current source comprising:
   a plurality of input stages for receiving differential inputs;
   an output stage responsive to the input stages for providing a differential output; each input stage including an input transconductance differential pair and a feedback transconductance differential pair; said differential input being connected to one input of said input transconductance differential pair and one input of said feedback transconductance differential pair, said differential output being fed back to one input of said input transconductance differential pair and one input of said feedback transconductance differential pair for balancing the currents in said transconductance differential pairs over the input range.

18. The switched current source of claim 17 in which each transconductance differential pair includes an input transistor and a feedback transistor; the input transistor in one pair responsive to the positive input and the feedback transistor in the other pair responsive to the negative feedback having their positive electrodes connected to a first node and the input transistor in the other pair responsive to the negative input and the feedback transistor in the one amplifier responsive to the positive feedback having their positive electrodes connected to second node.

19. The switched current source of claim 18 in which said transistors are bipolar junction transistors.

20. The switched current source of claim 18 in which said transistors are field effect transistors including MOSFETs and JFETs.

21. A switched current source comprising:
   a plurality of input stages for receiving differential inputs;
   at least one output stage responsive to the input stages for providing a differential output.
      each input stage including an input transconductance differential pair and a feedback transconductance differential pair; said differential input being connected to one input of said input transconductance differential pair and one input of said feedback transconductance differential pair, said differential output being fed back to one input of said input transconductance differential pair and one input of said feedback transconductance differential pair for balancing the currents in said transconductance differential pair over the input range.

22. The switched current source of claim 21 in which each transconductance differential pair includes an input transistor and a feedback transistor; the input transistor in one pair responsive to the positive input and the feedback transistor in the other pair responsive to the negative feedback having their positive electrodes connected to a first node, and the input transistor in the other pair responsive to the negative input and the feedback transistor in the one amplifier responsive to the positive feedback having their positive electrodes connected to second node.

23. The switched current source of claim 22 in which said transistors are bipolar junction transistors.

24. The switched current source of claim 22 in which said transistors are field effect transistors including MOSFETs and JFETs.

* * * * *